Jan. 18, 1966 J. H. HOFFMAN ETAL 3,230,486
HIGH INPUT IMPEDANCE AMPLIFIER
Filed June 15, 1960
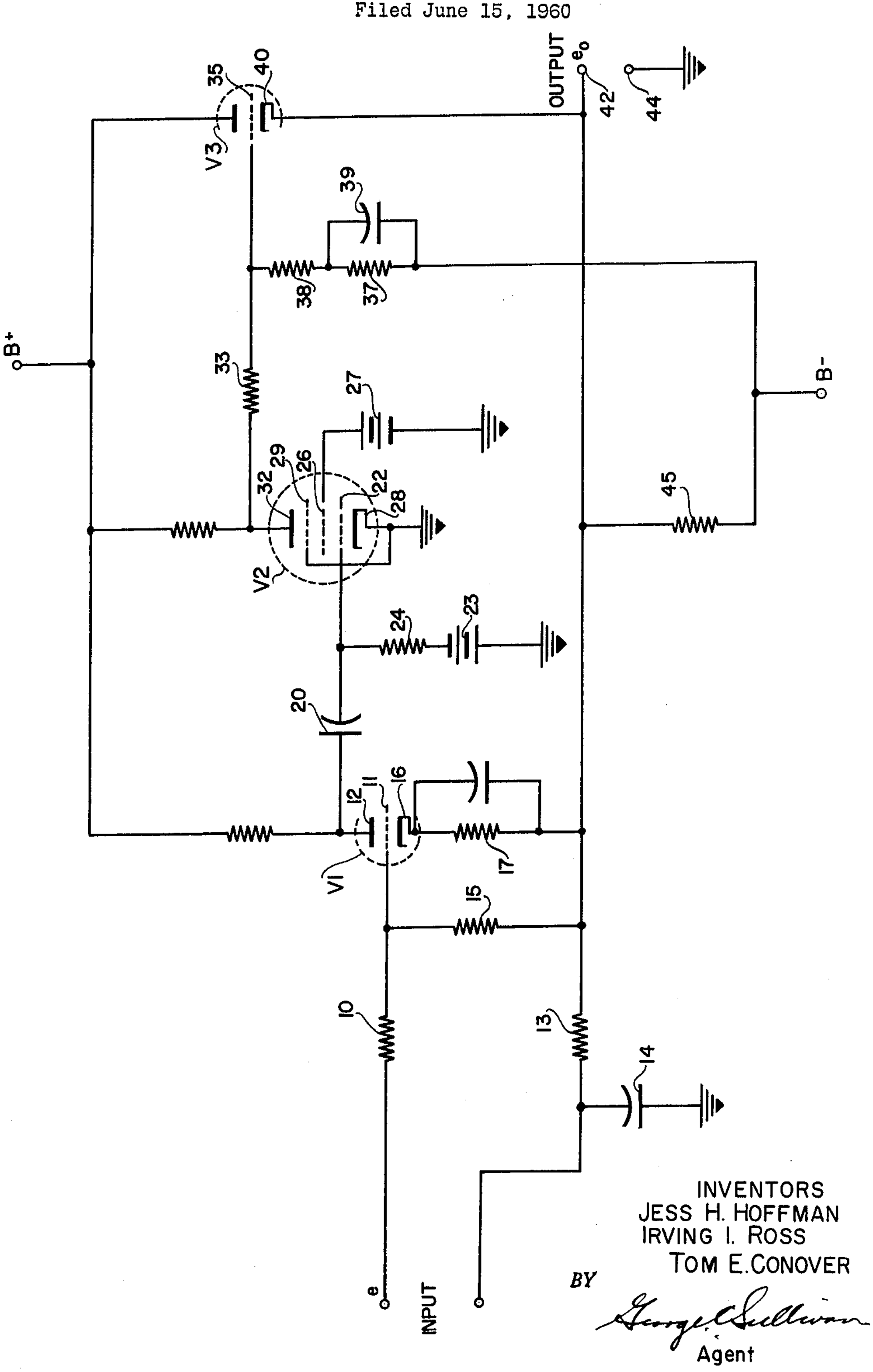
INVENTORS
JESS H. HOFFMAN
IRVING I. ROSS
TOM E. CONOVER
BY George C. Sullivan
Agent // United States Patent Office 3,230,486

Patented Jan. 18, 1966

3,230,486
HIGH INPUT IMPEDANCE AMPLIFIER

Jess H. Hoffman, North Hollywood, and Irving I. Ross, Altadena, Calif., and Tom E. Conover, Littleton, Colo., assignors to Lockheed Aircraft Corporation, Burbank, Calif.

Filed June 15, 1960, Ser. No. 36,277
3 Claims. (Cl. 330—150)

This invention relates to an improved unity gain high input low output impedance feedback amplifier circuit to provide an output signal which is an extremely faithful replica of an applied input signal. In the electronic arts generally and particularly in the communication, TV, computer, automatic control and instrumentation arts high input low output impedance amplifiers are extensively used. They are characterized as having a high input impedance, a low output impedance and a voltage gain which is very nearly equal to unity. Such circuits are ideal isolation circuits and are extensively used to couple high impedance voltage sources to low impedance loads especially where the phase or polarity inversion characteristic of ordinary amplifiers is to be avoided.

A usual method for coupling a high input impedance to a low output impedance is the cathode follower where an input signal from a high impedance source is applied to a grid of a vacuum tube the grid resistor of which has a large value and the cathode resistor of which has a relatively small value with the output being taken across the cathode resistor. However, where an extremely high input impedance is required and where stable gain is a necessity it has been found that the cathode follower lacks suitable gain stability due to variations of tube characteristics and resistance values.

It is an object of the present invention therefore to provide a high input impedance amplifier wherein means are provided to increase the feedback gain so that the input impedance may be higher and the over-all gain variation be less. This is accomplished by applying the input signal to the grid of the input stage and through proper amplification the same signal is fed back to the cathode resistor of the same stage so that the feedback signal will be nearly equal to the input signal.

It is another important object of the present invention to provide a high input low output impedance amplifier which has a minimum phase shift of an amplified carrier.

It is another important object of the present invention to provide a high input low output impedance amplifier having harmonic distortion of a minimum value.

It is another important object of the present invention to provide a high input impedance amplifier whose amplification will be extremely accurate. The loop gain necessary to achieve this must be at least ten thousand and preferably should be higher.

It is another important object of the present invention to provide a high input low output impedance amplifier wherein the final unity gain is not dependent upon the stability of input and/or feedback resistors. In prior operational amplifier or voltage feedback circuits an established unity gain is dependent upon the ratio of the feedback resistor in proportion to the command input resistor. By the use of the circuit according to the present invention the instability of these resistors does not affect the stability of the gain of the amplifier.

Other advantages of the present invention will become apparent from the reading of the following specification when taken in conjunction with the appended drawing.

It will be observed that the input voltage will equal the output voltage while the output impedance will be extremely low. In the normal cathode follower, the input impedance will be determined by the grid resistor while the output impedance will be determined by the cathode resistor as well as the tube parameters. An immediate disadvantage is obvious in that the output voltage will be appreciably less than the input voltage. It is desirable that the ratio of output voltage to input voltage be as close to unity as possible.

It will be noted that in a conventional cathode follower circuit the input resistance is very nearly equal to the resistance value from grid to ground. If the grid leak resistance is returned to a tapped portion of the cathode resistance (as in a biased cathode follower) a higher input impedance will be realized.

In the figure the excursion of the plate voltage of vacuum tube V–1 will be proportional to the input grid voltage. This voltage applied to the pentode V–2, is again amplified and inverted. The amplified and inverted signal at plate 32 of V–2 is then applied to grid 35 of V–3 effecting a current flow through V–3 which is proportional to the current flowing through V–1 because of the common cathode resistor 45. As a result, the voltage drop from grid 11 to ground will be very nearly equal to the output voltage co-produced by the combined current flows of V–1 and V–3 through the common cathode resistance 45. The voltage on cathode 16 of V–1 will be in-phase with the voltage on cathode 40 of V–3 and the input voltage will also be in-phase with this voltage.

In summary the high impedance input signal is applied through resistor 10 to the grid of vacuum tube V–1. The plate voltage of V–1 is applied to the grid of tube V–2 where the voltage is amplified and reversed in-phase to coincide with the phase of the incoming voltage. The voltage from the plate of V–2 is applied to the grid of V–3 which completes a feedback circuit from its cathode through grid resistor 15 of V–1. Resistors 10 and 15 comprise a voltage divider to which is applied both the input signal $e$ and the output signal $e_0$. The output signal $e_0$, appearing across terminals 42 and 44, is shunted by resistor 13 connected in series with low impedance condenser 14. Since the impedance of condenser 14 is low, $e_0$ will effectively appear across resistor 13. The voltage divider action of resistors 10 and 15 will cause part of this signal ($e_0$) to appear across resistor 15. By reason of the same voltage divider action in the opposite direction, a portion of the input signal ($e$) also will appear across resistor 15. Therefore, the voltage across resistor 15 is the algebraic sum of a portion of the input signal ($e$) and a portion of the output signal ($e_0$), which is of the opposite phase. Proper bias for tube V–1 is applied from a B minus source through a cathode resistor 17. The B— source is referenced to ground (terminal 44). The A.C. component of the signal on plate 12 of tube V–1 is passed by condenser 20 to grid 22 of pentode tube V–2. Proper grid bias is provided by a battery 23 through resistor 24.

The pentode tube V–2 provides a large amplification factor and reverses the phase of the signal from the triode V–1. A large positive potential is applied to the screen grid 26 of V–2 and the suppressor grid 29 is connected to the cathode 28 in the conventional manner. The signal appearing on plate 32 of V–2 is applied through resistor 33 to the grid 35 of V–3. Grid bias is applied from a B minus source to grid 35 through resistors 37 and 38. The combination of resistors 33, 38 and 37 and condenser 39 forms a lag network to prevent high frequency instability. The cathode 40 of tube V–3 is connected directly to output terminal 42. The other output terminal 44 is grounded. The output signal $e_0$ appears across resistor 45 and the negative supply B—. Since the negative supply is merely a bias voltage, the A.C. portion of the signal appears across resistor 45 and is also referenced to ground. A load requiring low input impedance is connected across the terminals 42 and 44.

Condenser 14 is used to provide an A.C. ground reference for the input signal and the combination of condenser 14 and resistor 13 prevents the output signal from appearing across the input terminals. The impedance of condenser 14 is extremely low at the frequency of operation. Therefore, the lower side of the input is effectively referenced to ground. The output $e_0$ which appears at the junction of resistors 13 and 15 is directly referenced to ground. Any small residual signal that might appear across condenser 14 is impeded from appearing at the junction of resistors 13 and 15 by resistor 13.

Since the output signal $e_0$ has very nearly the same value as the input signal $e$ the gain of the amplifier is very nearly unity. That this is an extremely stable gain may be shown as follows:

If the gains of the three tubes are denoted as $K_1$, $K_2$ and $K_3$ respectively then the output signal is essentially equal to $K_1K_2K_3$ times the difference between the input and output. That is $$e_0=K_1K_2K_3(e-e_0) \text{ or } e_0(K_1K_2K_3+1)=K_1K_2K_3e$$

or $$\frac{e_0}{e}=\frac{K_1K_2K_3}{K_1K_2K_3+1}=\frac{1}{1+\frac{1}{K_1K_2K_3}}$$

Since V–2 is a pentode the gain of V–2 (denoted as $K_2$) is extremely high. Therefore $$\frac{1}{K_1K_2K_3}$$

is extremely small and negligible as compared to 1. Thus the amplifier gain, $$\frac{e_0}{e}$$

is very close to unity. The signal $e-e_0$ is the algebraic sum of the input signal and the output signal, which is of opposite phase, and is therefore negative when the input signal is positive and vice versa. Thus, the expression "$e-e_0$" may have either algebraic sign associated with it.

That the output impedance is very low can be shown as follows:

The effect of a low output impedance is to maintain a relatively constant output voltage with increased current drawn by the load.

As the load current varies the output voltage would ordinarily tend to vary. However, in this amplifier any such variation is applied to cathode 16 and is therefore also reflected by plate 12 and grid 22. V–2 amplifies this variation so that it appears at plate 32 and grid 35 in the opposite phase. It therefore also appears at cathode 40 in the phase opposite to that of the original variation and effectively cancels it maintaining the output voltage essentially constant. The A.C. load impedance for the plate 12 is a parallel combination of resistors including resistor 24 since the impedance of condenser 20 is low at the frequency of operation. The A.C. load impedance for the plate 32 is a series-parallel combination of resistors 33, 37, 34 and condenser 39. The only load impedance for V–3 is in the cathode circuit and its action is similar to that of a conventional cathode follower.

A high input impedance, low output impedance amplifier has been disclosed which has minimum phase shift and distortion and which has a stable gain extremely close to unity. It will be apparent that pentodes may be used in place of V–1 and V–3 with equal advantage within the spirit of the invention.

We claim the following combination and their equivalents as our invention:

1. A high input, low output impedance amplifier comprised of a first, second and third vacuum tube each comprised of at least a cathode, a grid and a plate, a first input terminal connected to the grid of the first vacuum tube, the grid of the first vacuum tube being connected through a resistor to an output terminal, the cathode of the first vacuum tube being connected through a resistor to the output terminal, a B— voltage source being connected to the output terminal, a B+ voltage source being connected to the plates of the first and second tubes through corresponding load impedances and directly to the plate of said third vacuum tube, the cathode of the second vacuum tube being connected to ground, means to apply the plate output voltage of the first vacuum tube through a condenser to the grid of the second vacuum tube, means to apply the plate output voltage of the second vacuum tube through a resistor to the grid of the third vacuum tube, means connecting said B— voltage source to one end of a parallel R.C. circuit, means to connect the other end of said parallel R.C. circuit through a resistor to the grid of the third vacuum tube, means to connect the cathode of the third vacuum tube to the output terminal, a resistor connecting a second input terminal to the output terminal, a condenser connected between the second input terminal and ground, and means to connect a load between the output terminal and ground so the voltage which appears across the output terminal and ground will approximately equal the input voltage but be of a lower impedance.

2. A high input, low output impedance amplifier including first, second and third vacuum tubes each having at least a cathode, a grid, and a plate, a grid leak resistor for the grid of the first vacuum tube, a cathode resistor for the cathode of the first vacuum tube, a load impedance for the plate of the first vacuum tube, means to connect the grid leak resistor and the cathode resistor of the first vacuum tube to an output terminal, a B— voltage source, means to apply said B— voltage source to the output terminal, a source of B+ voltage connected to the load impedance of said first vacuum tube, means to apply an input signal to the grid of the first vacuum tube, means for providing a low impedance return path to ground for said input signal, a series resistor having one end connected to said low impedance return path means and the other end to said output terminal, means to apply the plate output voltage of the first vacuum tube to the grid of the second vacuum tube, a second load impedance for the plate of the second vacuum tube connected to said B+ voltage source, means to apply the voltage appearing across the load impedance of the second tube through a resistor to the grid of the third tube, means to connect said B— voltage source to one end of a parallel R.C. circuit, means to connect the other end of said parallel R.C. circuit through a resistor to the grid of the third vacuum tube, means to connect the plate of the third vacuum tube to said B+ voltage source, means to connect the cathode of the second vacuum tube to ground, and means to connect the cathode of the third vacuum tube to the output terminal so as to add to the voltage drop across the grid resistor in such a manner so that the output terminal will have a potential with respect to ground substantially equal to the potential applied to the first vacuum tube but with a lower impedance.

3. An amplifier having a high input impedance, a low output impedance and substantially unity gain, comprising: first, second, and third vacuum tubes connected in cascade and each having at least a cathode, a grid, and a plate; means for providing a positive operating potential to the plates of said vacuum tubes; first and second input terminals; a ground terminal; an output terminal; an input circuit network including a first resistor connected between said first input terminal and the grid of said first vacuum tube, a second resistor connected between the grid of said first vacuum tube and said output terminal, a third resistor connected between said second input terminal and said output terminal, and a condenser connected between said second input terminal and said ground terminal; the cathode of said first vacuum tube being connected through a resistor to said output terminal, a B— voltage source connected through a resistor to said output terminal, a parallel R.C. network having one end connected to said B— voltage source and the other end connected to the grid of said third vacuum tube, the cathode of said second vacuum tube being connected to ground, means to connect the cathode of said third vacuum tube to said output terminal, and means to connect a load between said output terminal and said ground terminal so that the voltage which appears across said output terminal and said ground terminal will substantially equal the input voltage but be of a lower impedance.

References Cited by the Examiner

UNITED STATES PATENTS

| | | | |
|---|---|---|---|
| 2,508,586 | 5/1950 | Veneklasen | 330—153 X |
| 2,666,815 | 1/1954 | Chapin | 330—153 X |
| 2,687,474 | 8/1954 | Richmond | 330—91 X |
| 2,777,904 | 1/1957 | Milbourne | 330—150 X |
| 2,831,975 | 4/1958 | Catherall | 330—91 X |
| 2,835,749 | 5/1958 | McCormack | 330—91 X |
| 2,858,379 | 10/1958 | Stanley | 330—28 X |
| 2,869,068 | 1/1959 | Morcerf et al. | 330—91 X |

ROY LAKE, *Primary Examiner.*

BENNETT G. MILLER, NATHAN KAUFMAN, *Examiners.*